US005601731A

United States Patent [19]
Hillmer

[11] Patent Number: 5,601,731
[45] Date of Patent: Feb. 11, 1997

[54] PROCESS FOR THE PRODUCTION OF AN OPTOELECTRONIC COMPONENT HAVING A DEFINED AXIAL VARIATION OF THE COUPLING COEFFICIENT AND A DEFINED AXIAL DISTRIBUTION OF THE PHASE SHIFT

[75] Inventor: Hartmut Hillmer, Darmstadt, Germany

[73] Assignee: ANT Nachrichtentechnik GmbH, Backnang, Germany

[21] Appl. No.: 401,168

[22] Filed: Mar. 9, 1995

[30] Foreign Application Priority Data

Mar. 9, 1994 [DE] Germany .......................... 44 07 832.3

[51] Int. Cl.$^6$ .............................. H01L 21/00; B44C 1/22
[52] U.S. Cl. .................................. 216/2; 216/24; 216/41; 156/649.1; 156/659.11
[58] Field of Search ................................. 216/2, 24, 41, 216/11; 156/649.1, 654.1, 655.1, 659.11

[56] References Cited

U.S. PATENT DOCUMENTS

| | | | |
|---|---|---|---|
| 4,670,093 | 6/1987 | Maerz et al. | .......................... 156/649.1 |
| 4,824,747 | 4/1989 | Andrews . | |

FOREIGN PATENT DOCUMENTS

| | | |
|---|---|---|
| 0461632A2 | 6/1991 | European Pat. Off. . |
| 0566886A1 | 3/1993 | European Pat. Off. . |
| 0632299A2 | 6/1994 | European Pat. Off. . |
| 0632299A2 | 2/1995 | European Pat. Off. . |
| 3704622 A1 | 8/1988 | Germany . |
| 56-148880 | 11/1981 | Japan .................................. 156/649.1 |

OTHER PUBLICATIONS

Makoto Okai, Corrugation-Pitch Modulated . . . , Jun. 27, 1991.
Katsunari Okamoto, et al., Guided-Wave Optical Equalizer . . . , Aug. 1993.
Yazaki, P., et al, A GaInAsP/InP Tapered-Waveguide . . . , Dec. 1991.
M. Matsuda, et al, Conference on InP and related Compounds, 1991, pp. 1–4.
A. Talneau, et al, Electronics Letters, Jul. 1992, vol. 28, No. 15, pp. 1395–1396.
T. Numai, et al, Japanese Journal of Applied Physics, vol. 26, No. 11, 1987, pp. L 1910–L 1911.
S. Ogita, et al, Journal of Lightwave Technology, vol. 8, No. 10, 1990, pp. 1596–1604.
B. H. Soda, et al, IEEE Journal of Quantam Electronics, vol. QE-23, No. 6, 1987, pp. 804–814.
G. Chen, et al, Appl. Phys. Lett. 60, (21), 1992, pp. 2586–2588.
Y. Nakano, et al, IEEE Journal of Quantam Electronics, vol. 24, No. 10, 1988, pp. 2017–2032.
J. Kinsoshita, et al, IEEE Journal of Quantam Electronics, vol. 27, No. 6, 1991, pp. 1759–1766.

(List continued on next page.)

*Primary Examiner*—William Powell
*Attorney, Agent, or Firm*—Michael J. Striker

[57] ABSTRACT

The process for production of an optoelectronic component having a predetermined coupling coefficient distribution and a predetermined phase shift distribution includes providing a photomask defining lateral and axial geometry of the grating fields of the optoelectronic compound, particularly predetermined curved grating boundaries between regions of the optoelectronic component having the grating fields and grating-free regions; performing a spin-on deposition of a photoresist on the semiconductor layers of a semiconductor substrate; structuring the semiconductor layers so that a DFB or DBR grating structure is located between the spin-on photoresist and the semiconductor substrate; after performing the spin-on deposition of the photoresist, exposing the photoresist using the provided photomask to form the optoelectronic component in the semiconductor substrate; and after the exposing of the photoresist using the photomask, etching surfaces of the optoelectronic component which are to be free of the grating fields to remove material to a minimum depth reaching a horizontal xz-plane corresponding to deepest points in the grating trenches of the grating fields.

3 Claims, 4 Drawing Sheets

OTHER PUBLICATIONS

K. Tada, et al, Electronics Letters, vol. 20, no. 2, pp. 82–84.

Okamato, et al, Journal of Lightwave Technology, vol. 11, No. 8, 1993, pp. 1325–1330.

B. Broberg, et al, Appl. Phys. Lett. 47 919), 1985, pp. 4–6.

K. Kojima, et al, Journal of Lightwave Technology, vol. LT–3, No. 5, 1985, pp. 1048–1055.

M. Okai, et al, IEEE Journal of Quantam Electronics, vol. 27, No. 6, 1991, pp. 1767–1772.

PROCESS FOR THE PRODUCTION OF AN OPTOELECTRONIC COMPONENT HAVING A DEFINED AXIAL VARIATION OF THE COUPLING COEFFICIENT AND A DEFINED AXIAL DISTRIBUTION OF THE PHASE SHIFT

BACKGROUND OF THE INVENTION

The properties of optoelectronic components, which are based on DFB gratings or DBR gratings, such as for example lasers, laser amplifiers, filters, couplers, detectors, multiplexers, demultiplexers and switches, can be improved with this invention and optimized within certain limits.

The literature discloses a first group of solutions, which treats the production of a variation of the coupling coefficient in the axial direction.

An abrupt change of the coupling coefficient in the longitudinal direction of the component was achieved, for example by means of partial photoresist remasking after a partial dry etching of the DFB grating [for example M. Matsuda et al., Conference on InP and related compounds (1991)].

A continuous axial variation of the coupling coefficient K can be implemented by means of a double exposure of a photoresist layer applied to a wafer surface. After the double exposure, the photoresist contains the information of two superimposed and inter-penetrating homogeneous DFB gratings which, however, differ by $\Delta\Lambda$ in their grating period. [A. Talneau et al., Electron. Lett. 28, 1395 (1992)]. Depending on the choice of $\Delta\lambda$, this process enables in each case only a completely defined function K(z) as well as one and only one component length L, corresponding thereto, if the periodicity of the structure is used with a view to high component yield. The advantages which are offered by an arbitrary change of K(z), cannot be used with this process.

Furthermore, the literature discloses a second group of solutions, which treats the generation of one or more phase shifts over the axial extent of a single or of a small number of grating periods.

Depending on the level of the coupling coefficient, abrupt phase shifts in DFB gratings produce excessive numbers of photons at various strengths at the location of the phase shift or shifts, which can have a negative influence on some properties of optoelectronic components. Abrupt phase shifts are implemented, for example, by means of holographic processes [e.g. T. Numai et al., Jap. J. Appl. Phys. 26, L 1910 (1987)] or by means of electron beam lithography (EL).

The excessive numbers of photons at the location, for example of a $\lambda/4$ phase shift, can be somewhat weakened by splitting up the total amount of the phase shift over several spatially mutually separated phase shift components (multiple phase-shifts) [e.g. S. Ogita et al. J. Lightwave Technol. 8, 1596 (1990)]. The individual partial phase shifts, however, were also carried out abruptly here by means of electron beam lithography or holographic methods.

Furthermore, the literature discloses a third group of solutions, in which the generation of phase shifts is carried out via the axial variation of the effective refractive index. Thus, phase shifts are implemented, for example, also via a lateral broadening or narrowing of the stripe width of the active zone or of the active zone and adjacent layers over a specific length of the longitudinal component length [e.g. B. H. Soda et al., IEEE J. Quant. Electron. OE-23, 804 (1987), or G. Chen et al. Appl. Phys. Lett. 60, 2586 (1992)]. In this arrangement, the effective refractive index was changed in the longitudinal direction in a quasi-abrupt manner. This leads to undesired additional optical multiple reflections and optical interference effects at those points at which the refractive index changes abruptly. Furthermore, the advantages which are offered by a continuous phase shift distributed arbitrarily over a longer partial section, were not exhausted by a long way.

A further known solution contains a change, linear in the z-direction, of the lateral stripe width of the active layer and adjacent layers over a longitudinal partial section of the component, in order to distribute the phase shift spatially [e.g. Y. Nakano et al., IEEE J. Q. Electron. 24, 2017 (1988), or J. Kinoshita et al. IEEE J. Q. Electron. 27, 1759 (1991)]. Not all the advantages which are offered by an arbitrary continuous distribution of the phase shift were used.

Furthermore, the sinusoidal variation of refractive index by means of stripe width varied in the axial direction is known. This solution was suggested theoretically to achieve a complete single-mode emission [K. Tada et al. Electron. Lett. 20, 82 (1984)].

Furthermore, a continuous variation of refractive index in the axial direction has been described theoretically [J. Lightwave Technol. 11, 1325 (1993)]. The axial variation of the refractive index was indicated by means of lateral symmetrical reduction of the grating field width in an optical waveguide.

Furthermore, a solution for producing phase shifts is known, which is based on an expansion of the vertical thickness of the active layer or of adjacent waveguide layers over a specific length of the longitudinal component length [e.g. B. Broberg, et al. Appl. Phys. Lett. 47, 4 (1985) or K. Kojima et al. J. Lightwave Technol. LT-3, 1048 (1985)]. This leads to undesired additional optical multiple reflections and optical interference effects at the points at which the refractive index changes abruptly. In addition, the advantages which are made possible by a continuous phase shift distributed arbitrarily over a longer partial section, were not exhausted by a long way.

Further known solutions contain the generation of a phase shift via the axial variation of the grating period.

In the literature, examples are quoted for the abrupt changes of the grating period in the axial component direction. In the centrally disposed section of the laser resonator, a larger grating period was implemented holographically than in the side sections. This structure could be successfully used for reducing the optical line width [M. Okai et al., IEEE J. Quantum electron. 27, 1767 (1991)]. The central region of changed grating period serves for generating the phase shift. Abrupt grating period changes were generated with this structure. However, not all the advantages which are offered by a continuous variation of the coupling coefficient, were exhausted.

Within a specific framework, electron beam lithography (EL) also enables the implementation of phase shifts distributed in the local space via the changing of the grating period in the longitudinal direction. However, in the case of this process, the difference between adjacent grating periods is limited to larger values. As a consequence, only DFB gratings which have a small number of different sections, within which the grating period is constant, but which differ from section to section, can be produced using EL. No quasi-continuous variations of the grating period with the location can be achieved. Furthermore, EL is a complicated process and the EL pattern-writing time is very expensive.

Curved waveguides on homogeneous DFB or DBR grating fields can, as already known, be used for the definition of gratings with axially varying grating period. Using this method, defined phase shifts can also be generated via a deliberate axial variation of the grating period and the phase shifts simultaneously distributed axially in an arbitrary and quasi-continuous manner.

SUMMARY OF THE INVENTION

The object according to the invention consists in developing a process by means of which optoelectronic components, which are characterized by a defined axial variation of the coupling coefficient and a defined distribution of the phase shift, can be produced using simple means and as cost-effectively as possible. Using correspondingly deeper etching, a strong additional lateral waveguidance can be achieved. An axially distributed phase shift is achieved while avoiding the additional disturbing reflections, occurring in the case of many other processes, at the axial ends of those zones which generate the phase shift or represent a section with changed coupling coefficient.

The solution according to the invention relates to optoelectronic components having a periodically structured boundary surface between two semiconductor layers with different refractive indices, which effects an optical feedback of the guided light (DFB or DBR gratings; DFB=distributed feedback; DBR=distributed Bragg reflector). The most important feature of the structure are the especially arranged and characteristically limited DFB or DBR gratings, the distributed optical feedback being implemented by means of material gratings structured periodically in the longitudinal direction, so that a periodic variation of the real and/or imaginary part of the refractive index is achieved. The core of the optoelectronic component in this case comprises various semiconductor layer assemblies, which are placed on the semiconductor substrate, one above another in the vertical direction (y-direction). Each of these semiconductor layer assemblies is not necessarily homogeneous in the y-direction, but can also, for its part, be in turn constructed from various individual layers or from continuous transitions between various semiconductor layers. Each semiconductor layer assembly is therefore hereinafter also referred to in a simplifying manner as quasi-single layer, that is to say designated by the reference "semiconductor layer".

In the case of the laser-active semiconductor layer, the designation semiconductor layer also contains, for example, a number of potential wells (quantum wells) and a correspondingly sufficient number of potential barriers. Hereinafter, the refractive index of a semiconductor layer is to be understood as the refractive index averaged within this semiconductor layer assembly. The semiconductor substrate is arranged underneath the first semiconductor layer. The vertical doping profile of the structure is configured in accordance with known semiconductor laser design principles. If it is the case that the optoelectronic component is a laser, the pn transition is located in the vicinity or in the active semiconductor layer. In this arrangement, both n-conductive and also p-conductive semiconductor substrates can be used. Hereinafter, the reference "semiconductor wafer" is to be understood as either the semiconductor substrate, or the semiconductor substrate with a specific number of suitably grown semiconductor layers.

In the axial=longitudinal direction (z-direction), the grating has a constant grating period $\Lambda$, a constant grating trench depth a and a constant mark-space ratio $W/\Lambda$ ($0<W<\Lambda$), but does not extend in the lateral direction (x-direction), after the structuring step described in this process, over the entire component width, but has characteristic boundaries. These grating boundaries separate the regions having grating trenches, which can extend over the entire longitudinal length of the optoelectronic component, from the grating-free regions. For reasons of clarity, a mark-space ratio of the grating of $W/\Lambda=0.5$ was selected in FIGS. 1 to 3.

The starting point for the process according to the invention is an optoelectronic semiconductor component, which comprises a semiconductor substrate with semiconductor layers arranged in the vertical direction on the semiconductor substrate, and provided with a DFB or DBR grating structure of grating trench depth a. The process according to the invention is based on principles, known per se, of semiconductor structuring by means of photoresist, vacuum deposition processes, sputtering processes and etching processes.

According to the invention, after the spin-on deposition of the photoresist onto the grating structure of the semiconductor wafer, the exposure of the photo-resist is undertaken using photomasks. By means of the photomask, mathematical shapes of the curved grating field boundaries, desired for the optoelectronic component, are defined by means of corresponding design of the photomask with reference to the lateral and axial geometry. That means that the geometrical forms contained on the photomask determine, inter alia, the mathematical functions of the boundaries between the regions having grating trenches and the grating-free regions and thus essential parameters of the optoelectronic component.

According to the application sought for the optoelectronic component, the component geometry, the refractive index of the individual semiconductor layers and, in particular, the mathematical functions which characterize the course of the grating boundaries, are determined by means of computer optimization. As a result of the lateral width, varying quasi-continuously in the longitudinal direction, of the regions having grating trenches and of the grating-free partial regions, a defined and quasi-continuous axial change of the lateral effective refractive index and of the coupling coefficient is achieved. The developed photoresist structure itself can serve as etching mask for the structuring step, or a metal or insulation film structure generated by means of lift-off. In the case of a lift-off process, a thin insulating layer or metal layer or both are applied on the developed photoresist.

DESCRIPTION OF PREFERRED EMBODIMENTS

Figure 1:
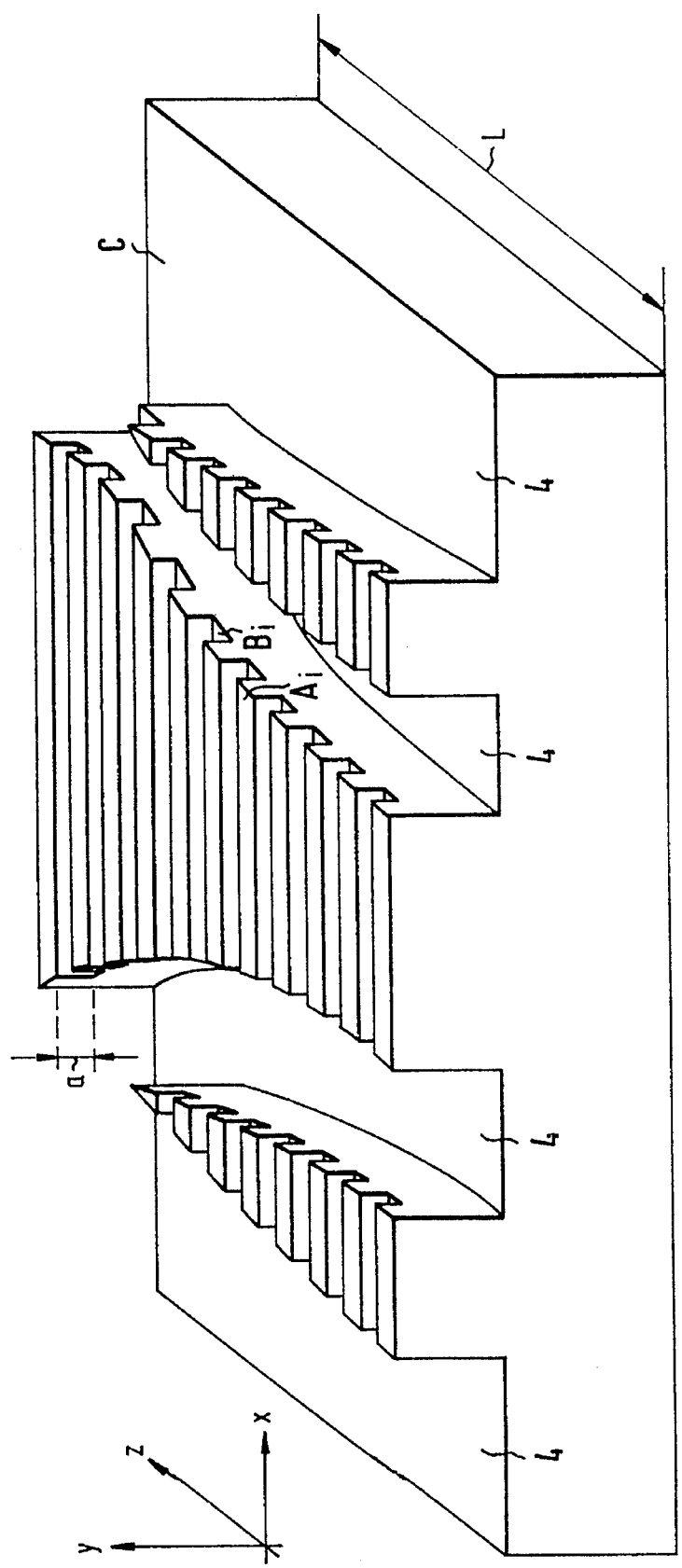
FIG. 1 is perspective view of a semiconductor wafer for an optoelectronic component produced in accordance with the present invention.

The solution according to the invention will be explained in more detail using several exemplary embodiments:

FIG. 1 shows the perspective view of a semiconductor wafer for an optoelectronic component in accordance with the described structuring step, which has defined the grating boundaries for the three regions having grating trenches, selected for this example.

Figure 2:
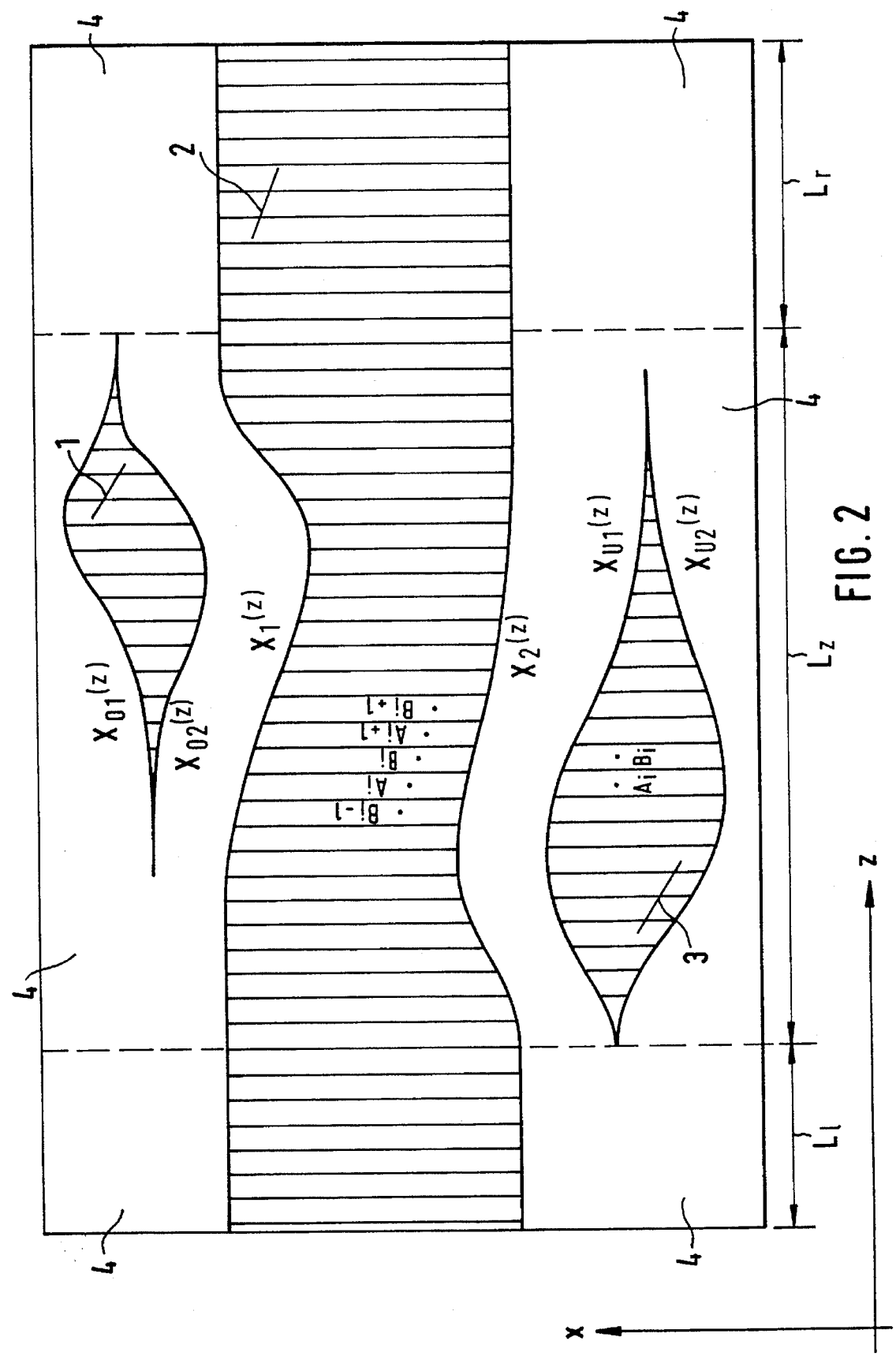
FIG. 2 is a top view and FIG. 4 is a cross-sectional view of an arrangement of three grating fields of the optoelectronic component produced in accordance with the present invention.

FIG. 2 shows a top view of a possible arrangement of three grating fields after carrying out the structuring step. The regions having grating trenches are delimited in this example by the functions $x_1(z)$, $x_2(z)$, $x_{o1}(z)$, $x_{o2}(z)$, $x_{u1}(z)$ and $x_{u2}(z)$, extending in a curve or a straight line, of the grating-free regions.

An essential point of the solution according to the invention is the implementation of the grating boundaries $x_1(z)$, $x_2(z)$, $x_{o1}(z)$, $x_{o2}(z)$, $x_{u1}(z)$ and $x_{u2}(z)$. Initially, the DFB or DBR grating is defined, over a greater lateral width d (10 µm>d>2 µm) or over the entire surface in the surface of the semiconductor wafer, with a unified grating trench depth a.

Figure 4:
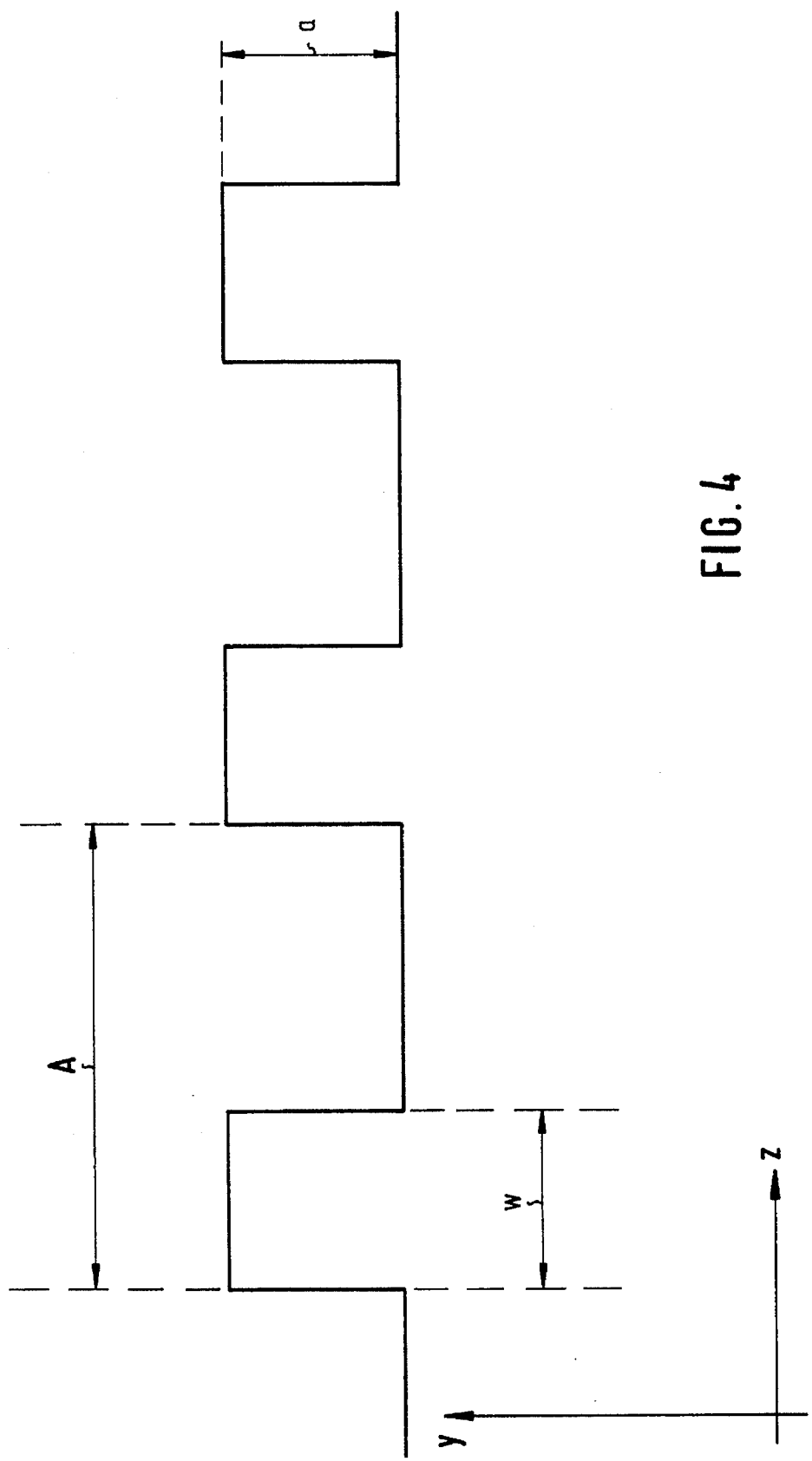

In a section in the yz-plane, the grating can either have a rectangular shape (FIG. 4), a triangular shape, a sinusoidal shape or a mixed shape. In FIG. 4, the case of an asymmetrical mark-space ratio is depicted: that is to say 2W is not equal to λ.

Figure 3:
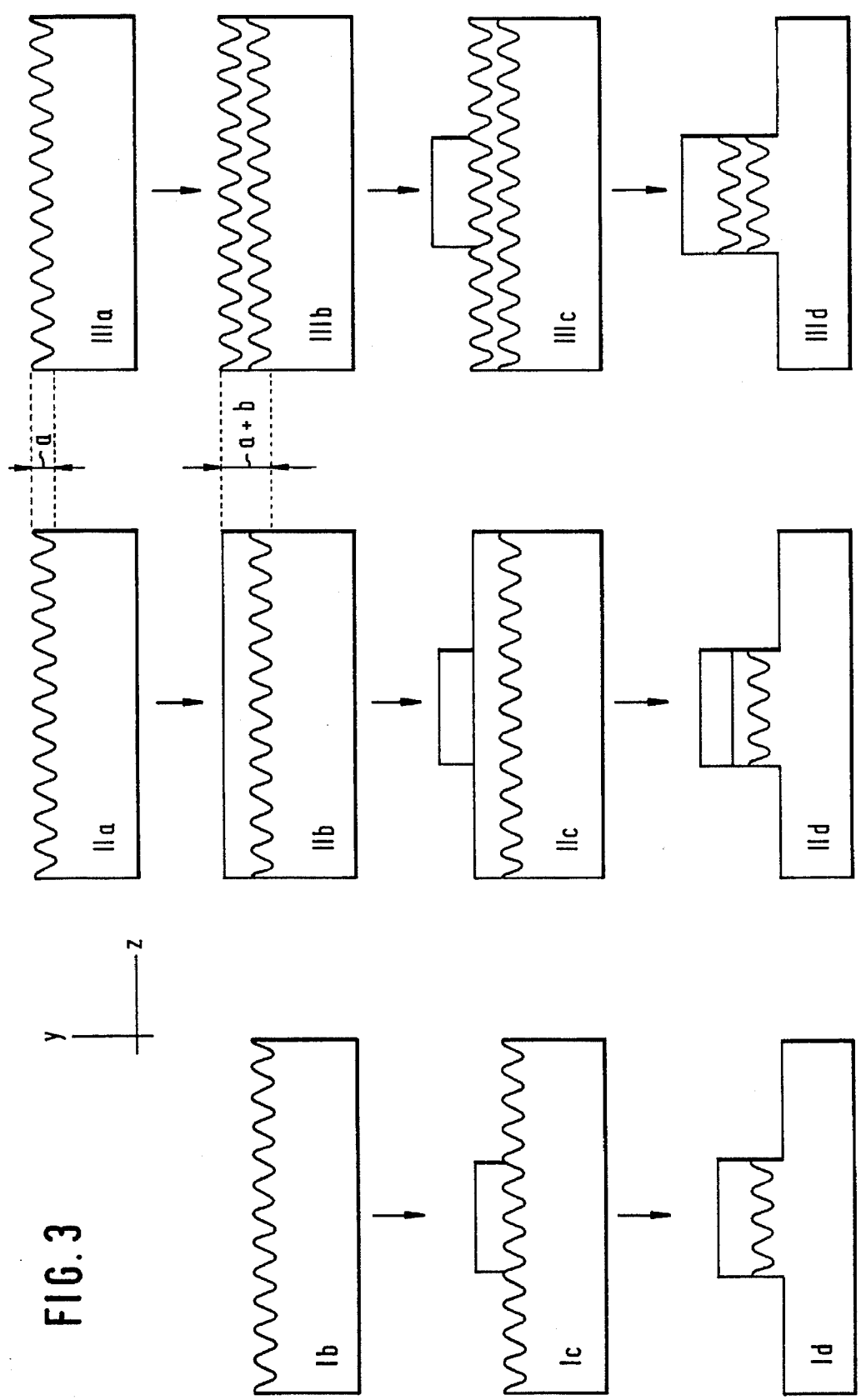
FIG. 3 is a view illustrating a process for producing an optoelectronic component in accordance with another embodiment of the invention.

With reference to the vertical position of the photoresist layer, with which the lateral grating boundary is generated in one structuring step, two variations are possible (see FIG. 3). Either the photoresist is directly applied to the DFB or DBR grating (FIG. 3 I:b=0), or the grating is covered with a further series of semiconductor layers of thickness b, before the application of the photoresist. In this second variation (FIG. 3 II and FIG. 3 III: b not equal to 0), the photoresist is applied to the surface of this series of semiconductor layers of thickness b. In so doing, the series of semiconductor layers of thickness b, during its growth, can either act in a levelling manner with reference to the grating (FIG. 3 III), or can reproduce the same grating structure again on its surface (FIG. 3 III). Corresponding mixed shapes reproduce the case occurring most often. The first variation, that is to say b=0, is represented in FIG. 1. This variation will be further described in the examples for reasons of clarity.

In FIG. 3 and in the following text, the more simple case is described, in which the structuring is undertaken directly using the developed photoresist structure (that is to say without metal or insulating film structure). By means of a photomask, whose geometric form has been determined by means of mathematical methods as a function of the desired parameters of the optoelectronic component, each region, in which the photoresist is to be exposed, and also the complementary regions, in which the photoresist remains unexposed, are determined. After the development of the photoresist, specific regions of the grating in the xz-plane are still protected by photoresist and others not (FIG. 3: Ic, IIc, IIIc). In the open, unprotected regions, the grating is completely removed in a subsequent structuring step by means of a wet-chemical etching process or a dry etching process, a material removal of at least the depth a or a+b, respectively, being undertaken (see FIG. 1 and FIG. 3: Id, IId, IIId). In so doing, the grating-free regions 4 in the xz-plane (see FIG. 1 and FIG. 2) are produced. The points C lie on the grating-free regions 4. Subsequently, the structure is grown over using a semiconductor material, its refractive index differing from the refractive index of the semiconductor layer in which the grating was defined.

Two possible embodiments of the example will now be explained. In the first possible embodiment, the grating was defined directly in the semiconductor substrate. Subsequently, this structure was grown over with a semiconductor material which has a higher refractive index than the semiconductor substrate. The exact series of layers above the semiconductor substrate varies in accordance with the application of the optoelectronic component. In the case of a semiconductor laser, the laser-active layer assembly in this possible embodiment lies above the grating.

In the second possible embodiment, the grating was produced in a series of layers already applied to the semiconductor substrate and having the grating depth a. Subsequently, the boundaries of the grating regions are determined in a subsequent structuring step in such a manner that on the entire xz-plane (see FIG. 1 and 2), in part, a material removal by at least the depth a is carried out, so that the grating-free regions 4 are produced. If the wave-guiding semiconductor layers of higher refractive index are located underneath the grating, this structure is grown over with a semiconductor material which has a smaller refractive index than the semiconductor material in which the grating was defined. The exact series of layers underneath and above the grating varies in accordance with the application of the optoelectronic component. In the case of a semiconductor laser, the laser-active layer assembly in this possible embodiment lies underneath the grating.

The mathematical form of the curves of the grating boundaries is decisive for the component proposed. In this arrangement, quite special weight is given to the functions $x_1=x_1(z)$ and $x_2=x_2(z)$, which separate the central region having grating trenches from the laterally adjacent grating-free partial regions (see FIGS. 1 and 2). By means of the lateral width of the grating boundaries $[x_1(z)-x_2(z)]$, varying quasi-continuously in the longitudinal direction, a defined and quasi-continuous change of the effective refractive index and of the coupling coefficient is achieved. By means of corresponding selection of the shape of the grating boundaries $x_1=x_1(z)$, $x_2=x_2(z)$, $x_{o1}=x_{o1}(z)$, $x_{o2}=x_{o2}(z)$, $x_{u1}=x_{u1}(z)$ and $x_{u2}=x_{u2}(z)$, the most diverse distributions of the lateral effective refractive index in the longitudinal direction (z-direction) can be achieved. The partial lengths $L_1$ and $L_r$, over which, as depicted in FIG. 2, the difference of the lateral widths $[x_1(z)-x_2(z)]$ does not change, can also have the length zero in the limiting case, or can also lie in the center of the component of the total length L. A narrowing of the region having grating trenches 2 in its central region (see FIG. 2) leads to a defined phase shift and a variation of the coupling coefficient just as effectively as a corresponding broadening. According to the application sought for the optoelectronic component, a computerized optimization of the component geometry, the refractive index values, and in particular the mathematical function of the grating boundaries $x_1=x_1(z)$, $x_2=x_2(z)$, $x_{o1}=x_{o1}(z)$, $x_{o2}=x_{o2}(z)$, $x_{u1}=x_{u1}(z)$ and $x_{u2}=x_{u2}(z)$ must be carried out. It is important that the vertical effective refractive index of the complete laser structure in the grating-free regions is different from the vertical effective refractive index of the grating fields. For this comparison, the latter is to be averaged over a quadratic surface having edge lengths 2Λ lying parallel to the grating webs.

In FIG. 1 and 2, elevations and partial elevations, respectively, of an optoelectronic component having a DFB grating are shown. However, the use of DBR gratings is also possible, in which there are also completely grating-free regions in the longitudinal direction. In the case that the optoelectronic component is a laser, the laser-active semiconductor layer does not necessarily have to extend in the lateral direction x over the entire component surface. However, in this example it must in any case be located under or over the central, grating-bearing region 2. The current injection into the active semiconductor layer, seen laterally, is expediently limited to those parts of the laser-active layer which lie close to the maximum of the guided light. Thus, only one stripe having a length of about L and a lateral width which is somewhat larger or of comparable size to the maximum of [$x_1(z)-x_2(z)$], which is located in the region 0<z<L, is electrically pumped. The lateral design of the laser-active layer, and the enabling of the current injection can be carried out in accordance with known component design principles, for example in the form of a buried laser structure (buried heterostructure) or a ridge structure.

The numerical magnitude of the coupling coefficient K is predominantly determined by the depth of the grating trenches a, the local lateral spacing of the grating boundaries [$x_1(z)-x_2(z)$] from each other, and by the mark-space ratio W/Λ and, to a lesser extent, also by the course of $x_{o1}(z)$, $x_{o2}(z)$, $x_{u1}(z)$ and $x_{u2}(z)$. The local coupling coefficient at the point $z_i$ results computationally from the local lateral overlap of the grating regions with the light intensity distribution in the xy-section planes at the point $z_i$ in the component. The waveguiding (intensity distribution of the guided light in the xy-plane) is determined by solving the Maxwell equations with boundary conditions for the central wavelength of the component. The central wavelength is, for example, the sought Bragg wavelength of a single-section DFB laser or, for example, the wavelength about which wavelength tuning is to be carried out in a multiple-section component. The waveguiding in the xy-plane is determined by the refractive index variation in this plane. The vertical thicknesses and the refractive indices of the individual semiconductor layers are selected such that, at a central wavelength, a good waveguidance is achieved, taking into account the lateral dimensions of the individual semiconductor layers and their lateral refractive index variations, which is in particular also given by $x_1(z)$; $x_2(z)$; $x_{o1}(z)$; $x_{o2}(z)$; $x_{u1}(z)$ and $x_{u2}(z)$.

The calculation of the amount of the phase shift from the mathematical curve $x_1(z)$, $x_2(z)$, $x_{o1}(z)$, $x_{o2}(z)$, $x_{u1}(z)$ and $x_{u2}(z)$ can be implemented by various methods. One possible method is represented by an approximation solution, which is characterized by the sequential computerized solution of a plurality of one-dimensional wave equation problems.

1. Calculation of the waveguiding in the y-direction for the central wavelength [see, for example, S. Hansmann, J. Lightwave Technol. 10, 620 (1992)]: The points $A_1, \ldots A_i, \ldots A_p$ lie, seen in the z-direction, respectively in the center of the grating webs. The points $B_1, \ldots B_i, \ldots B_p$ lie, seen in the z-direction, respectively in the center of the grating trenches. The positions of the points in the z-direction are designated by $z_{Ai}$ and $z_{Bi}$.

a) At the point $A_i$: In the exemplary embodiment in FIG. 2, grating webs are in each case located at the points ( ... $A_{i-1}$, $A_i$, $A_{i+1}$, ... ) because of the structuring of the semiconductor boundary surface in which the grating is located. The individual layer thicknesses in the y-direction and the corresponding refractive indices enter into the computation. From the computation, there results an effective vertical refractive index $n_{\mathit{eff},y}$ (A). At all the points ( .. . $A_{i-1}$, $A_i$, $A_{i+1}$ ... ), there is present in FIG. 1 and 2 the same vertical effective refractive index, if the series of semiconductor layers extends over the lateral width of the central grating field, shown in the drawings.

b) For a specific grating trench depth a at the point $B_i$: Grating trenches exist in each case at the points ( ... , $B_{i-1}$, $B_i$, $B_{i+1}$, ... ) in the exemplary embodiment in FIG. 1 and 2. From this, there results in FIG. 2, at all points ( ... , $B_{i-1}$, $B_i$, $B_{i+1}$, ... ) the same effective refractive index $n_{\mathit{eff},y}$ (B) in the y-direction, if the series of semiconductor layers extends over the lateral width of the central grating field represented in the figures.

c) At a point C, which lies in the grating-free regions: If, for example, the laser-active layer or another semiconductor layer does not extend over the entire lateral width in which the light field is guided with a not inconsiderable intensity, this boundary is additionally correspondingly to be taken into account.

2. Calculation of the waveguiding in the x-direction for the central wavelength along a section at all points $A_1 \ldots A_i \ldots A_p$ and $B_1 \ldots B_i \ldots B_p$, taking into account the results of point 1. In this case, p is the total number of grating trenches in the component. [The corresponding grating trenches in the various regions having grating trenches (1;2;3) are not counted twice here, see FIG. 2]. The width [$x_1(z)-x_2(z)$] of the central grating region enters decisively into the computation. From the computation there results in principle, at each point $z_{Ai}$ and $z_{Bi}$, a different refractive index $n_{\mathit{eff},xy}$ ($z_{Ai}$, a) and $n_{\mathit{eff},xy}$ ($z_{Bi}$,a). Because of the quasi-continuous functions $x_1=x_1(z_i)$, $x_2=x_2(z_i)$, $x_{o1}=x_{o1}(z_i)$, $x_{o2}=x_{o2}(z_i)$, $x_{u1}=x_{u1}(z_i)$ and $x_{u2}=x_{u2}(z_i)$, there thus results a quasi-continuous axial change of the refractive index $n_{\mathit{eff},xy}(z_{Ai},a)$ and $n_{\mathit{eff},xy}(z_{Bi},a)$. For the grating web which is located at the point $A_i$, the width [$x_1(z_{Ai})-x_2(z_{Ai})$] is used approximately as the lateral grating web width. This is correspondingly true for all points $A_1 \ldots A_i \ldots A_p$. For the grating trenches in which the point $B_i$ is located, the width [$x_i(z_{Bi})-x_2(z_{Bi})$] is used approximately as lateral grating trench width. This is correspondingly true for all points $B_1 \ldots B_i \ldots B_p$. The method is the same for the other boundaries $x_{o1}(z)$, $x_{o2}(z)$ and $x_{u2}(z)$.

A further method for the computation of the axial variation of the refractive index in the xy-plane from the mathematical curve $x_1(z)$, $x_2(z)$, $x_{o1}(z)$, $x_{o2}(z)$, $x_{u1}(z)$ and $x_{u2}(z)$ is based in part on the computation of an effectively two-dimensional wave equation model at all points $A_1$ and $B_i$. The refractive index curve in all xy-planes, which go through the points $A_i$ and $B_i$ and have the z-axis as normal, enter into the computation. The computerized solution of this problem is significantly more complicated, but leads directly to the values $n'_{\mathit{eff},xy}(z_{Ai},a)$ and $n'_{\mathit{eff},xy}(z_{Bi},a)$. This computation is carried out at all points $A_1 \ldots A_i \ldots A_p$ and $B_1 \ldots B_i \ldots B_p$.

The results of the first method represent an approximate solution of the more precise results of the second method. However, hereinafter, no distinction is made between $n'_{\mathit{eff},xy}(z_{Ai},a)$ and $n_{\mathit{eff},xy}(z_{Ai},a)$ and between $n'_{\mathit{eff},xy}(z_{Bi},a)$ and $n_{\mathit{eff},xy}(z_{Bi},a)$.

The following variables are now defined and used:

W=longitudinal grating web width

[Λ−W]=longitudinal grating trench width

β=wave vector $\lambda_o$=wavelength of light in vacuo $\beta(z_i)$=wave vector at the point $z_i$ Furthermore:

$$z_j = (z_{Ai} + z_{Bi})/2 \quad \text{(for } j = i\text{)} \tag{1}$$

$$n_{\mathit{eff},xy}(z_j) = \left[ \frac{W}{\Lambda} n_{\mathit{eff},xy}^2(z_{Ai}) + \left[ 1 - \frac{W}{\Lambda} \right] n_{\mathit{eff},xy}^2(z_{Bi}) \right]^{0.5}$$

For the definition of the phase shift, there are several possibilities. Two simple possibilities, which contain approximations, are specified hereinafter: firstly, reference to a comparison phase, which is mathematically linked to the minimum value $n_{\mathit{eff},xy}(z_j)=n_{\mathit{eff},mi}$ for fixed values of a and for fixed functions $x_1(z)$; $x_2(z)$; $x_{o1}(z)$; $x_{o2}(z)$; $x_{u1}(z)$ and $x_{u2}(z)$, or secondly, reference to a comparison phase, which is mathematically related to the maximum value $n_{eff,xy}(z_j) = n_{eff,ma}$. In this case, $n_{eff,ma}$ is the maximum and $n_{eff,mi}$ is the minimum value of all $n_{eff,xy}(z_j)$, which occur in the longitudinal direction at the points $z_j$. Possible values j are integral and lie in the range $1 \leq j \leq p$. In the following, $n_{eff,m}$ stands for $n_{eff,ma}$ or $n_{eff,mi}$, according to which selection was made at the time of the definition. The wave vector difference is calculated in accordance with $\Delta \beta = \beta(z_j) - \beta_m$, where $\beta_m$ is linked to $n_{eff,m}$. The wave vector at the point $z_j$ is defined in the following way:

$$\beta(z_j) = \frac{2\pi}{\lambda_o} \cdot n_{eff,xy}(z_j) \qquad (2)$$

The phase shift $\Delta\phi$, which is generated at the point $z_j$ within one grating period, is calculated with respect to a grating period, linked to $n_{eff,m}$, in accordance with $$\Delta\phi_j = \Lambda \cdot \Delta\beta(z_j) \qquad (3)$$

The total phase shift of the grating results from the sum of the phase shift components of each individual grating period.

$$\Delta\phi = \sum_{j=1}^{p} \Lambda \cdot \Delta\beta(z_j) \qquad (4)$$

The spacing $[x_1(z)-x_2(z)]$ can be selected between 0.1 μm and 5 μm, according to the requirement on the component, by means of corresponding selection of the functions $x_1(z)$ and $x_2(z)$. The spacing $[x_{o1}(z)-x_{o2}(z)]$ to $[x_{u1}(z)-x_{u2}(z)]$ can lie between 1 μm and twenty times the central wavelength. In the event that, in the component, lateral single-mode emission at the central wavelength is desired, provision must be made at the time of dimensioning for a sufficiently large difference with reference to the "optical confinement" between the lateral base mode and the next higher lateral mode. The less the difference $[x_1(z)-x_2(z)]$ in the longitudinal direction is varied, the larger must the depth of the structuring of the grating-free regions C be selected for a fixed phase shift.

Example: To implement, for example, a λ/4 phase shift, it is ensured, by selection of the limiting functions and of the refractive indices and the vertical thicknesses of the individual layers, that $\Delta\phi = \pi/2$. The depth of the grating trenches a and the local difference $[x_1(z)-x_2(z)]$ predominantly determine the local magnitude of the coupling coefficient K at the point z. The coupling coefficient K is further dependent on the mark-space ratio W/Λ, the limiting functions and the detailed vertical layer construction (thickness of the individual semiconductor layer assemblies and their refractive indices).

The larger the difference of the grating limits $[x_1(z)-x_2(z)]$, the larger the refractive index difference between the two semiconductor layers adjoining the grating and the deeper the grating trenches a, the larger is the coupling coefficient K in each case.

The larger the change of the difference of the grating boundaries $[x_1(z)-x_2(z)]$ in the longitudinal direction, the larger is the longitudinal variation of the coupling coefficient.

The lateral waveguiding is automatically supported and brought about by means of the proposed structure, in particular of the lateral height and depth profile of the limiting surface, in which the grating is located and, in particular, the limiting surfaces which are additionally exposed in FIG. 1 (see FIG. 1). The lateral waveguiding in this case is greater, the greater the refractive index difference on both lateral sides of the grating. Furthermore, the lateral waveguiding is strongly dependent on the lateral position of the grating boundaries. In this case, the contribution of the outer lateral boundaries of the grating $x_{o1}, x_{o2}, x_{u1}$ and $x_{u2}$ (in FIG. 2) to the lateral waveguiding can only be detected if they are placed such that they are arranged in the region in which the guided light field still has a considerable intensity.

The parameters (in particular the boundaries extending in the curve, a, W/Λ, the individual layer thicknesses, their lateral extents and their refractive indices) contained in the axial variation of the effective refractive index $n_{eff,xy}(z_{Ai},a)$ and $n_{eff,xy}(z_{Bi},a)$ can be optimized to improve characteristic values of the optoelectronic component. For instance, one or more of the following advantages can be simultaneously achieved for a semiconductor laser:

smaller spectral line widths of the optical emission reduced spatial hole-burning and thus improvement of the longitudinal single-mode stability, and the enabling of higher optical powers, better high-frequency properties, such as reduced frequency chirp and higher limiting frequencies under high-frequency modulation, more stable longitudinal single-wave behavior at high optical output power, possible reduction of threshold current of the main mode (for example the Bragg mode) and possible increase in the threshold current of the side modes, linearization of the current-power characteristic curve and improvement of the light yield, increase in the yield in single-mode components or in components of particular specification and enlargement of the wavelength tuning range in multi-section lasers.

By means of the solution according to the invention, an exceptionally precise setting of the axial variation of the coupling coefficient and of the axial distribution of the phase shift in the longitudinal direction is achieved.

I claim:

1. Process for production of an optoelectronic component having a defined coupling coefficient distribution and a defined phase shift distribution, the optoelectronic component comprising a semiconductor substrate provided with a plurality of semiconductor layers arranged in a vertical direction in the semiconductor substrate and with a DFB or DBR grating structure provided with a plurality of grating trenches having a grating trench depth (a), using semiconductor structuring techniques including photoresist techniques and etching techniques, said process comprising the steps of:

a) providing a photomask defining lateral and axial geometry of grating fields of the optoelectronic component, the defining of the lateral and axial geometry of the grating fields including defining grating boundaries between regions of the optoelectronic component having the grating trenches and grating-free regions, said grating boundaries having a mathematical curvature;

b) performing a spin-on deposition of a photoresist on the semiconductor layers of the semiconductor substrate;

c) structuring the semiconductor layers so that the DFB or DBR grating structure is located between the spin-on photoresist and the semiconductor substrate;

d) after performing the spin-on deposition of the photoresist in step b), exposing the photoresist using the photomask provided in step a) to form the optoelectronic component in the semiconductor substrate; and e) after the exposing of step d), etching surfaces of the optoelectronic component which are to be free of the grating fields to remove material to a minimum depth reaching a horizontal xz-plane passing through the semiconductor substrate corresponding to deepest positions in the grating trenches of the grating fields.

2. Process as defined in claim 1, wherein the spin-on deposition of the photoresist is performed so that said photoresist is directly spun on the grating structure and wherein said minimum depth of material removal corresponds to the grating trench depth (a).

3. Process as defined in claim 1, further comprising providing additional semiconductor layers on the grating structure, said additional semiconductor layers having a total thickness (b) above the grating structure, and wherein the photoresist is spun-on the additional semiconductor layers and the minimum depth of the material removal corresponds to a sum of the total thickness (b) of the semiconductor layers and the grating trench depth (a).

* * * * *